United States Patent
Liu

(10) Patent No.: US 6,336,499 B1
(45) Date of Patent: Jan. 8, 2002

(54) CPU HEAT SINK MOUNTING STRUCTURE

(76) Inventor: Hong Tsai Liu, No. 29, Alley 3, Lane 240, Chung Hsing Rd., Long Tan Hsiang, Tao Yuan Hsien (TW)

( * ) Notice: Subject to any disclaimer, the term of this patent is extended or adjusted under 35 U.S.C. 154(b) by 0 days.

(21) Appl. No.: 09/867,672

(22) Filed: May 31, 2001

(51) Int. Cl.⁷ .............................. F28F 7/00; F24H 3/02; H05K 7/20; H01L 23/34
(52) U.S. Cl. ...................... 165/80.3; 165/121; 165/125; 165/185; 174/16.3; 257/718; 257/719; 257/722; 361/697
(58) Field of Search ................................ 165/80.3, 121, 165/125, 185; 361/697; 257/718, 719, 722; 174/16.3

(56) References Cited

U.S. PATENT DOCUMENTS

| | | | | |
|---|---|---|---|---|
| 5,579,827 A | * | 12/1996 | Chung | 165/185 |
| 5,708,564 A | * | 1/1998 | Lin | 165/80.3 |
| 5,740,041 A | * | 4/1998 | Lin | 165/80.3 |
| 5,943,209 A | * | 8/1999 | Liu | 361/697 |
| 6,021,045 A | * | 2/2000 | Johnson | 165/80.3 |
| 6,188,577 B1 | * | 2/2001 | Liu | 165/80.3 |
| 6,208,518 B1 | * | 3/2001 | Lee | 174/16.3 |

* cited by examiner

*Primary Examiner*—Ira S. Lazarus
*Assistant Examiner*—Tho Duong
(74) *Attorney, Agent, or Firm*—Bacon & Thomas, PLLC

(57) ABSTRACT

A CPU heat sink mounting structure includes a cylindrical heat sink having a coupling portion at one end, a retaining plate coupled to the coupling portion of the cylindrical heat sink, the retaining plate having four equiangularly spaced oblong holes, two first hook holes disposed at one side and hooked on respective hooks of the CPU holder at one side, and a locking lever pivoted thereto at an opposite side and turned to lock/unlock the retaining plate and the CPU holder, a holding down plate coupled to the coupling portion of the cylindrical heat sink and retained between the retaining plate and the CPU holder and rotated through an angle relative to the retaining plate to hold down the cylindrical heat sink.

3 Claims, 4 Drawing Sheets

CPU HEAT SINK MOUNTING STRUCTURE

BACKGROUND OF THE INVENTION

The present invention relates to a CPU heat sink mounting structure and, more particularly, to such a CPU heat sink mounting structure, which can easily positively be installed in the CPU holder to efficiently carry heat from the CPU in the CPU holder.

During working of the CPU of a computer system, much heat is produced. A variety of heat sinks have been disclosed for use with fan means to dissipate heat from the CPUs of personal computers. When a heat sink is used, fastener means shall be used to secure the heat sink to the CPU holder. Conventional fastener means for this purpose may be complicated, or easy to fall out of position.

SUMMARY OF THE INVENTION

The present invention has been accomplished to provide a CPU heat sink mounting structure, which has a simple structure and achieves high performance. It is still another object of the present invention to provide a CPU heat sink mounting structure, which is easy to install. It is still another object of the present invention to provide a CPU heat sink mounting structure, which fits any of a variety of fans. According to the present invention, the CPU heat sink mounting structure comprises a cylindrical heat sink having a coupling portion at one end, a retaining plate coupled to the coupling portion of the cylindrical beat sink, the retaining plate having a center opening, which receives the coupling portion of the cylindrical heat sink, four oblong holes equiangularly spaced around the center opening of the retaining plate, two first hook holes disposed at one side and hooked on respective hooks of the CPU holder at one side, and a locking lever pivoted thereto at an opposite side and turned to lock/unlock the retaining plate and the CPU holder, a holding down plate attached to the retaining plate and coupled to the coupling portion of the cylindrical heat sink, the holding down plate having four protruded spring strips respectively engaged into the oblong holes of retaining plate and stopped against the cylindrical heat sink, and a C-shaped clamping ring clamped on the coupling portion of the cylindrical heat sink to secure the holding down plate and the retaining plate to the cylindrical heat sink.

DETAILED DESCRIPTION OF THE PREFERRED EMBODIMENT

Figure 1:
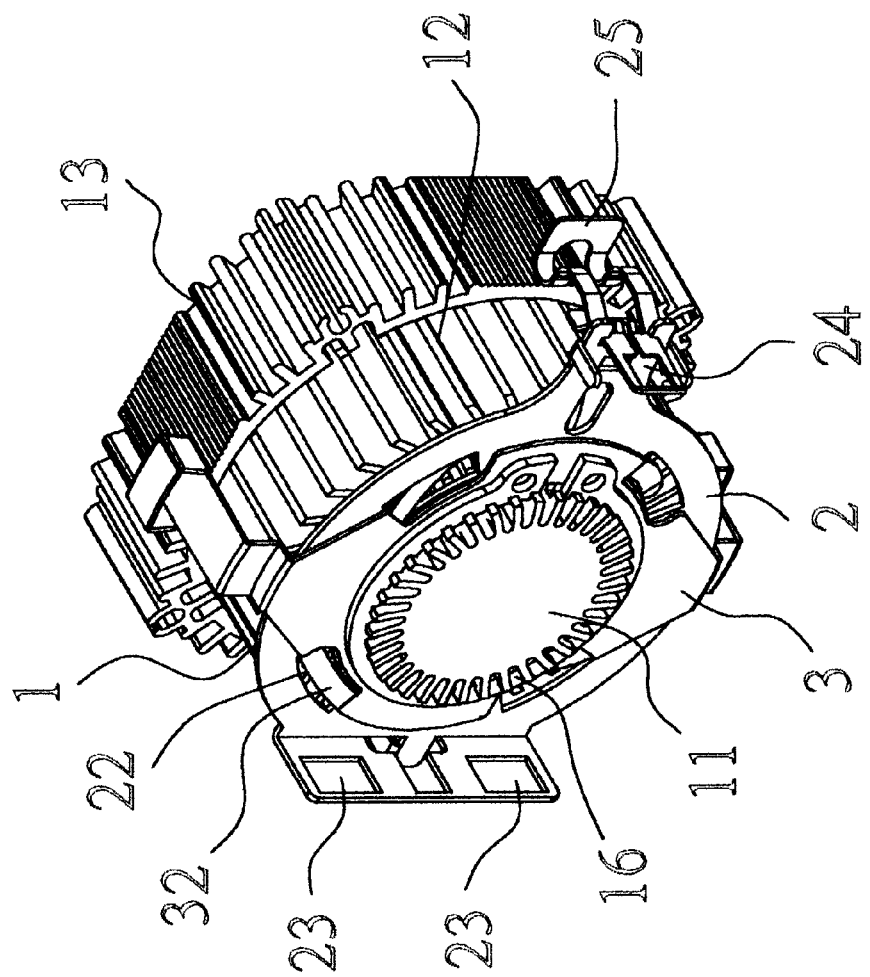
FIG. 1 is a perspective view of a CPU heat sink mounting structure according to the present invention.
Figure 2:
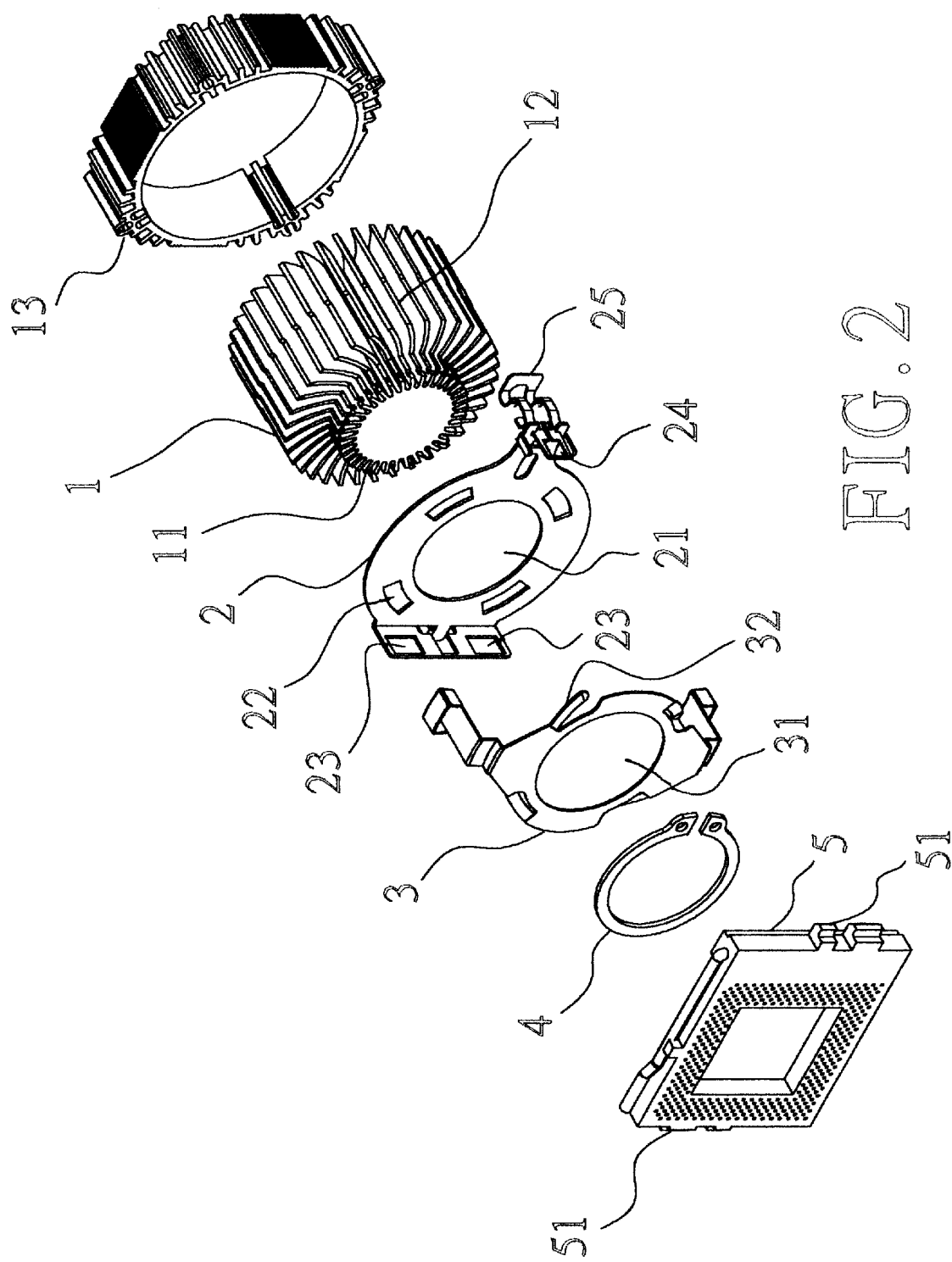
FIG. 2 is an exploded view of the CPU heat sink mounting structure according to the present invention.

Referring to FIGS. 1 and 2, the present invention is generally comprised of a fan mount 13, cylindrical heat sink 1. a retaining plate 2, a holding down plate 3, and a C-shaped clamping ring 4.

The fan mount 13 fits over the top end of the cylindrical heat sink 1. The cylindrical heat sink 1 comprises a coupling portion 11 axially protruded from one end thereof, and a plurality of radiation fins 12 of smoothly arched cross section radially spaced around the periphery. The retaining plate 2 comprises a center opening 21, which receives the protruded coupling portion 11 of the cylindrical heat sink 1, four oblong holes 22 equiangularly spaced around the center opening 21, two hook holes 23 disposed at one side, and a locking lever 25 pivoted thereto at one side opposite to the hook holes 23. The locking lever 25 has a hook hole 24 in one end thereof. The holding down plate 3 comprises a center through opening 31, and four protruded spring strips 32 cut from the body thereof and equiangularly spaced around the periphery corresponding to the oblong holes 22 of the retaining plate 2.

The assembly process of the present invention is outlined hereinafter with reference to FIGS. 1 and 2 again. The top cover 13 is covered on the top end of the cylindrical heat sink 1, and then the retaining plate 2 is attached to the bottom end of the cylindrical heat sink 1, enabling the coupling portion 11 to be engaged into the center opening 21 of the retaining plate 2, and then the holding down plate 3 is attached to the retaining plate 2 to couple the center opening 31 to the coupling portion 11 of the cylindrical heat sink 1, and to force the spring strip 32 into the oblong holes 23 of the retaining plate 2, and then the C-shaped clamping ring 4 is clamped on the coupling portion 11 of the cylindrical heat sink 1 to secure the holding down plate 3 and the retaining plate 2 to the cylindrical heat sink 1.

Figure 3:
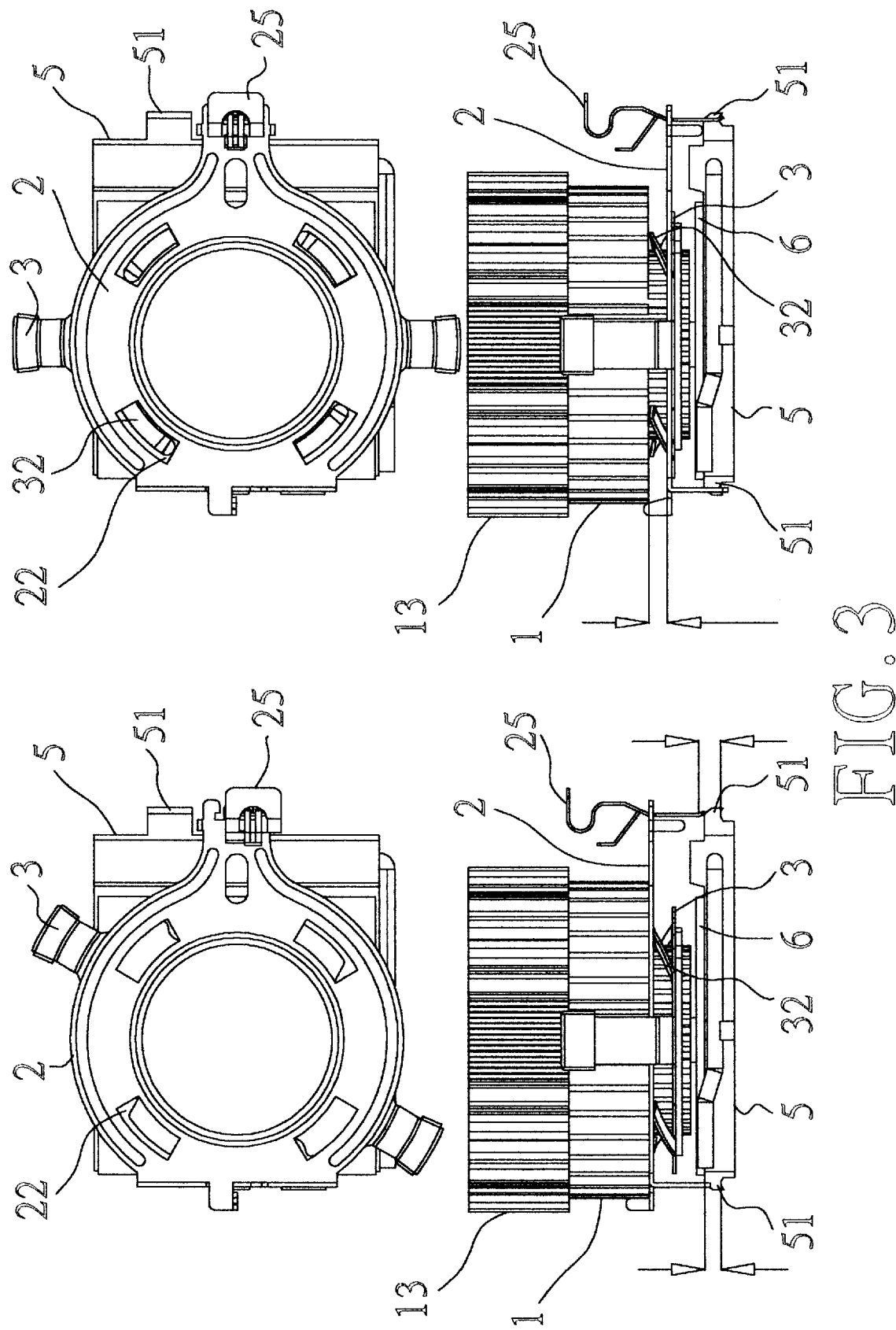
FIG. 3 is different sectional views of the present invention showing different positions of the holding down plate relative to the retaining plate.

When fastening to the CPU holder 5, as shown in FIG. 3, the hook holes 23 and 24 are respectively hooked on the respective hooks 51 of the CPU holder 5, and then the locking lever 25 is turned from the unlocking position to the locking position, keeping the coupling portion 1 of the cylindrical heat sink 1 positively secured to the top surface of the CPU 6 in the CPU holder 5, and then the holding down plate 3 is rotated through an angle, causing the spring strip 32 to impart an upward pressure to the cylindrical heat sink 1.

Figure 4:
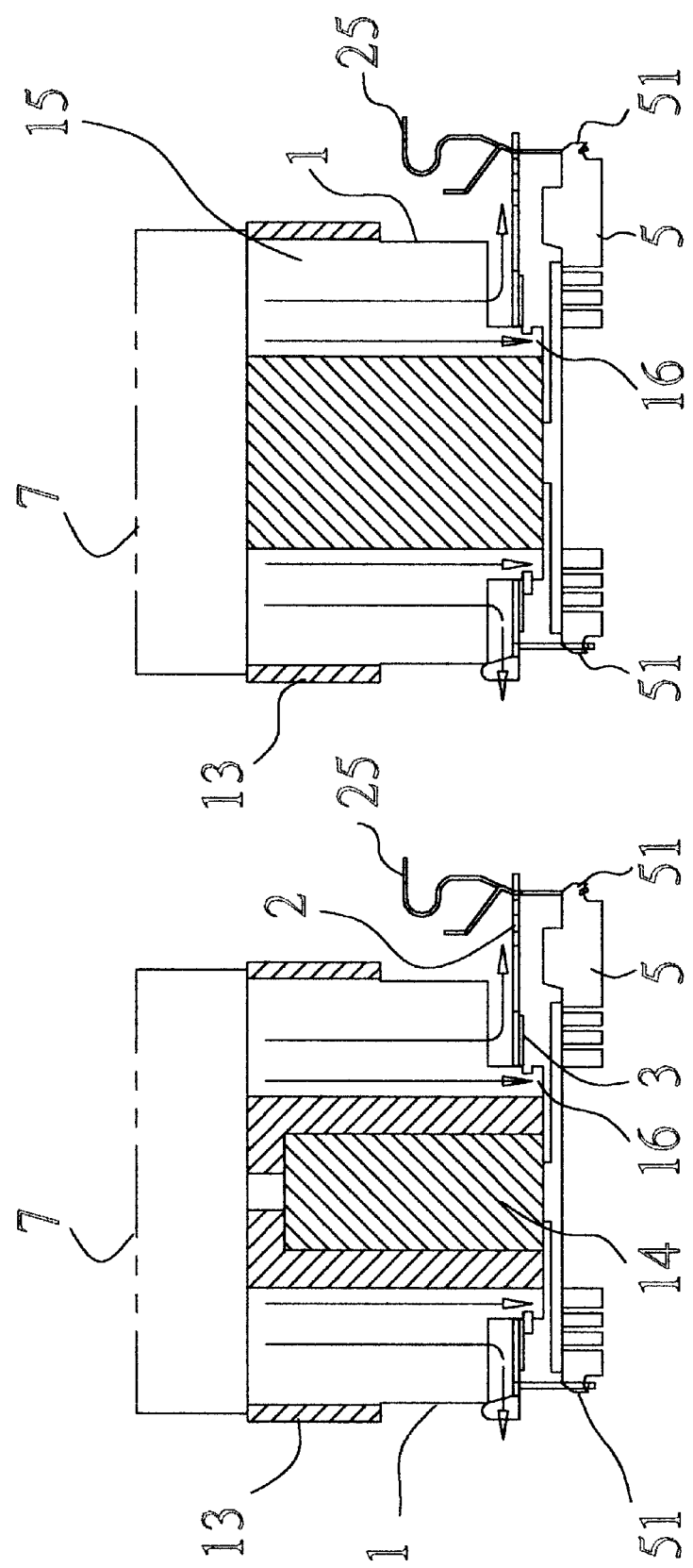
FIG. 4 is sectional side views of an alternate form of the present invention.

FIG. 4 shows an alternate form of the present invention. According to this alternate form, the cylindrical heat sink 1 has a heat conductive core member 14 adapted to receive heat from the CPU 6 in the CPU holder 5, and two air passageways 15 and 16 symmetrically disposed on the inside and adapted to guide currents of air from the fan 7 at the top of the cylindrical heat sink 1 to the CPU holder 5 to cool down the CPU in the CPU holder 5.

It is to be understood that the drawings are designed for purposes of illustration only, and are not intended for use as a definition of the limits and scope of the invention disclosed.

What the invention claimed is:

1. A CPU heat sink mounting structure fastened to a CPU holder to dissipate heat from a CPU in said CPU holder, comprising:
    a cylindrical heat sink, said cylindrical heat sink comprising a coupling portion axially protruded from a bottom end thereof, and a plurality of radiation fins of smoothly arched cross section radially spaced around the periphery thereof;
    a retaining plate coupled to said cylindrical heat sink, said retaining plate comprising a center opening, which receives the protruded coupling portion of said cylindrical heat sink, four oblong holes equiangularly spaced around the center opening of said retaining plate, two first hook holes disposed at one side and hooked on respective hooks of the CPU holder at one side, and a locking lever pivoted thereto at an opposite side and turned to lock/unlock said retaining plate and said CPU holder;

a holding down plate attached to said retaining plate at one side opposite to said cylindrical heat sink and coupled to the protruded coupling portion of said cylindrical heat sink, said holding down plate comprising a center through opening, which receives the protruded coupling portion of said cylindrical heat sink, and four protruded spring strips equiangularly spaced around the periphery there and respectively engaged into the oblong holes of said retaining plate; and a C-shaped clamping ring clamped on the protruded coupling portion of said cylindrical heat sink to secure said holding down plate and said retaining plate to said cylindrical heat sink.

2. The CPU beat sink mounting structure of claim 1 further comprising a fan mount covered on said cylindrical heat sink at a top side opposite to said retaining plate and adapted to support a fan.

3. The CPU heat sink mounting structure of claim 1 wherein said cylindrical heat sink comprises a heat conductive core axially extended on the inside and adapted to receive heat from the CPU in said CPU holder.

* * * * *